United States Patent [19]

Hart et al.

[11] Patent Number: 4,906,947
[45] Date of Patent: Mar. 6, 1990

[54] MILLIMETER WAVE MICROSTRIP VOLTAGE-CONTROLLED OSCILLATOR WITH ADJUSTABLE TUNING SENSITIVITY

[75] Inventors: Rebecca A. Hart, Plymouth; John R. Lamberg, Minnetonka; Donald R. Singh, Minneapolis, all of Minn.

[73] Assignee: Honeywell, Inc., Minneapolis, Minn.

[21] Appl. No.: 322,173

[22] Filed: Mar. 13, 1989

[51] Int. Cl.$^4$ ............................................... H03B 9/14
[52] U.S. Cl. ......................... 331/107 SL; 331/107 G; 331/177 V; 333/204; 333/238; 333/246
[58] Field of Search ............. 331/99, 107 SL, 107 G, 331/177 V, 117 D; 333/238, 246, 24 C, 161, 204, 205, 222, 219

[56] References Cited

U.S. PATENT DOCUMENTS

| | | | |
|---|---|---|---|
| 3,566,315 | 2/1971 | Vinding | 333/204 |
| 4,034,313 | 7/1977 | Jones et al. | 331/107 SL |
| 4,310,809 | 1/1982 | Buck et al. | 331/177 V |
| 4,574,256 | 3/1986 | Singh | 331/107 Sl |
| 4,652,836 | 3/1987 | Accatino et al. | 331/117 D |

Primary Examiner—Siegfried H. Grimm
Attorney, Agent, or Firm—Haugen and Nikolai

[57] ABSTRACT

A voltage-controlled oscillator (VCO) especially designed for use in the millimeter wave frequency band (Ka-band) and which exhibits an adjustable tuning sensitivity. A low tuning sensitivity is easily obtained, making it suitable for narrow-band FMCW applications. It comprises a Gunn diode as a negative resistance device and a voltage variable capacitance diode (varactor) as a tuning element. A fixed capacitance element is coupled in RF series with the varactor and microstrip transmission lines are configured to function as impedance matching, resonating and filtering elements. By incorporating the fixed capacitance in RF series with the varactor, the tuning sensitivity, measured in volts/Hz is markedly reduced. The VCO uses a novel RF structure which puts the fixed capacitance in RF series with the varactor, without introducing the fixed capacitance element in the varactor bias circuitry.

3 Claims, 1 Drawing Sheet

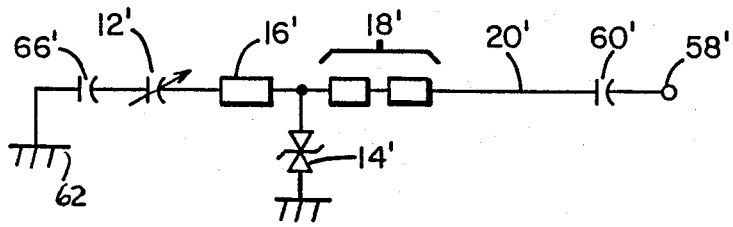
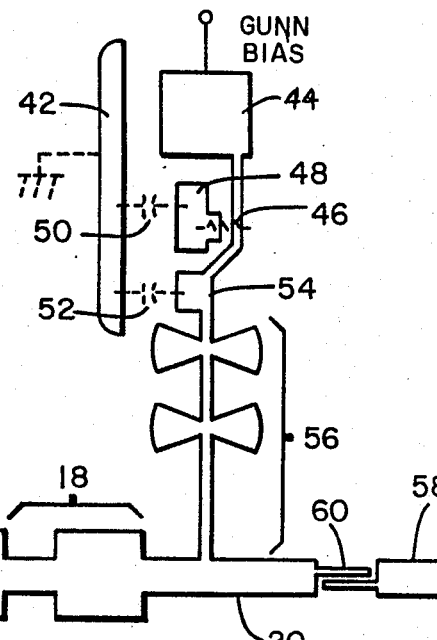
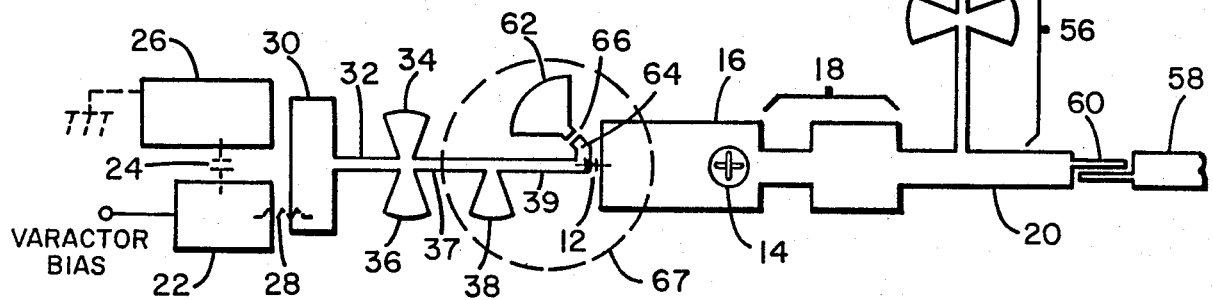
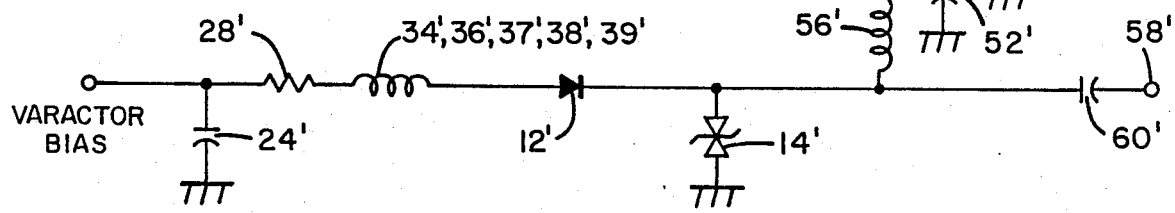
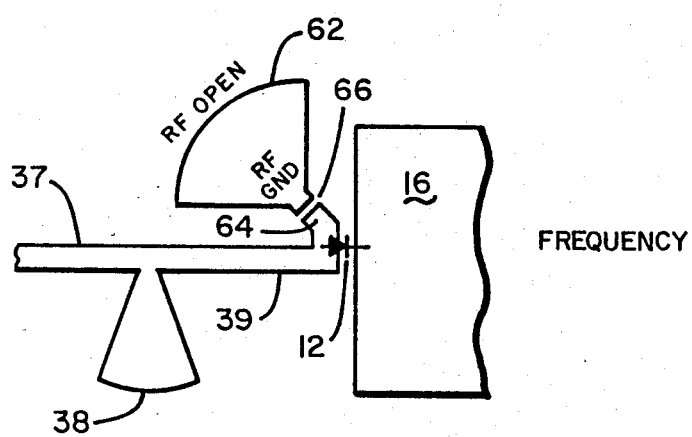
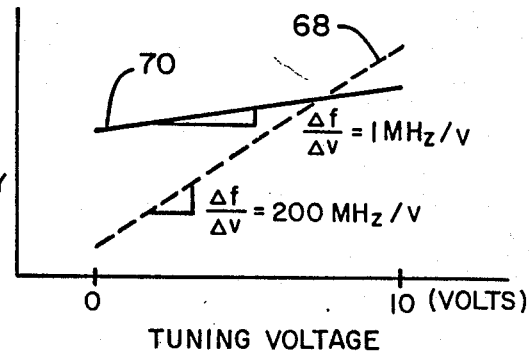

MILLIMETER WAVE MICROSTRIP VOLTAGE-CONTROLLED OSCILLATOR WITH ADJUSTABLE TUNING SENSITIVITY

UNITED STATES GOVERNMENT RIGHTS

This invention was made under Contract DAAK1085-C-0004 with the Department of the Army which affords the U.S. Government specified rights in and to the invention.

BACKGROUND OF THE INVENTION

1. Field of the Invention:

This invention relates generally to RF power sources, and more particularly to a high frequency voltage-controlled oscillator signal generator whose output signal frequency is determined by the amplitude of an externally applied tuning signal, and which is suitable for use in narrow-band FMCW applications.

2. Discussion of the Prior Art:

In millimeter wave or Ka band systems, such as radar and communications, there is a need for a signal generator or driver whose frequency can be varied with an applied low frequency or DC bias. The Singh U.S. Pat. No. 4,574,256, which is assigned to applicants' assignee, describes such a device and is somewhat closely related to the present invention. Like the present invention, it utilizes microstrip technology along with a Gunn diode and varactor to create a VCO for use in the Ka band. The VCO described in the aforereferenced Singh patent is ideally suited for broadband FMCW transmitting applications in that it is capable of providing a tuning bandwidth well in excess of two GHz when constructed with a hyperabrupt varactor diode. The tuning sensitivity of such a VCO is in excess of 200 MHz/V. Moreover, by utilizing a hyperabrupt varactor, a very linear frequency versus tuning voltage characteristic is achieved.

Where it is desired to provide a narrow-band FMCW driver, it is necessary that the tuning sensitivities be on the order of only 1 MHz/V. Using the circuit of the Singh patent, a frequency change of ±1 MHz results when only a tuning voltage change of ± 5 mV is applied. Such a small voltage is less than the typical electrical noise level existing in DC power supplies and, as such, the circuit of the Singh patent is found to be ill-suited for narrow-band FMCW applications.

It is accordingly a principal object of the invention to provide an improved millimeter wave microstrip VCO having an adjustable tuning sensitivity means incorporated therein and which is suitable for narrow-band FMCW applications. By utilizing a hyper-abrupt varactor, a very linear frequency versus tuning voltage characteristic is retained.

SUMMARY OF THE INVENTION

In accordance with the present invention a fixed capacitance element is inserted in series with the varactor to reduce the tuning sensitivity of the VCO. Specifically, the VCO uses a novel RF microstrip structure which keeps the fixed capacitive element in RF series with the varactor, but the capacitive element does not form a part of the dc bias circuitry. When using microstrip technology, this fixed capacitance element can be realized by providing a small gap in a microstrip line which functions as a distributed capacitor. Alternatively, a fixed capacitance element, such as a chip capacitor, can be used as well. By appropriately coupling the tuning varactor and the fixed capacitor in series with RF ground, implemented with a radial stub and maintaining a separate DC ground for the varactor, very low parasitic reactance is added to the series connected capacitance-varactor diode combination. A microstrip distributed bias filter, functioning as a RF choke couples the varactor to the external bias terminal.

DESCRIPTION OF THE DRAWINGS

FIG. 1 is a layout of the millimeter wave microstrip VCO in accordance with the present invention;

FIG. 2 is a RF equivalent circuit schematic diagram of the device of FIG. 1;

FIG. 3 is a DC equivalent circuit diagram of the device of FIG. 1;

FIG. 4 is an enlarged view of the portion of the circuit circled in FIG. 1; and

FIG. 5 illustrates the sensitivity curve of the VCO of the present invention contrasted to that of the prior art Singh U.S. Pat. No. 4,574,256.

DESCRIPTION OF THE PREFERRED EMBODIMENT

Referring first to FIG. 1, there is indicated generally by numeral 10 a millimeter wave microstrip voltage controlled oscillator having adjustable tuning sensitivity means in accordance with the present invention. More particularly, the drawing of FIG. 1 illustrates the conductive microstrip pattern etched or otherwise formed on an insulating substrate (not shown), the other side of which is covered by a continuous, conductive ground plane.

Before explaining in detail the constructional and operational features of the circuit of FIG. 1, it is deemed expedient to explain generally the makeup of that circuit in terms of its functional components. The semiconductor elements include a varactor diode 12 and a Gunn diode 14 which are coupled together by a microstrip impedance transformer 16. A further two-stage microstrip impedance transformer encompassed by the bracket 18 is used to match the impedance of the voltage controlled oscillator to a 50 ohm line 20.

DC bias for the varactor diode 12 is applied to the microstrip pad 22 which is capacitively coupled at 24 to a RF ground pad 26 and resistively coupled as at 28 to the pad 30 and microstrip line 32 to the anode electrode of the varactor diode 12. The conductive fan patterns 34, 36 and 38 together with the lines 37 and 39 comprise a RF choke to remove high frequency RF signals from the DC line 32 providing bias to the varactor diode.

In a similar fashion, DC bias is provided to the Gunn diode, via the bias circuitry enclosed by brackets 56. More particularly, the pad 42 is at RF ground while the pad 44 receives the DC bias signal from an external source (not shown). The DC bias line is resistively coupled as at 46 to a microstrip pad 48 which, in turn, is capacitively coupled as at 50 to the ground pad 42. A second capacitive coupling 52 exists between the RF ground pad 42 and the Gunn diode bias line 54. Again, the conductive fan patterns enclosed by brackets 56 at high frequencies function as a RF choke, i.e., a low pass filter, to remove RF energy from the bias lines. The DC bias signal flows through the 50 ohm line 20 and the two-stage microstrip impedance transformer 18 to the Gunn diode 14 itself.

The varactor diode 12 along with the impedance transformer 16 function as a resonator while the Gunn diode 14 constitutes the requisite negative impedance for producing sustained oscillations. The two-stage microstrip impedance transformer 18 delivers the RF energy to the 50 ohm line 20 which is ultimately delivered to the RF output terminal 58, via a DC block 60. The DC block circuitry 60 precludes the DC Gunn diode bias from appearing in the output.

The novelty of the present invention resides in the inclusion of the radial stub 62 which is spaced apart from an extension 64 of the line 39 to create a gap 66. The relevant portion of the microstrip circuit of FIG. 1 is enclosed by a circle 67 and that portion is illustrated in enlarged form in FIG. 4. At the RF frequencies involved, the gap 66 constitutes a distributed capacitance element in RF series with the varactor diode 12. This capacitive element, identified by numeral 66' in the RF equivalent circuit of FIG. 2, functions to reduce the tuning sensitivity, i.e., the unit frequency change per unit tuning voltage change, of the VCO 10. It is found that the tuning sensitivity is directly proportional to the size of the series capacitance which, of course, is determined by the size of the gap 66. That is to say, reducing the capacitance produced by the gap 66 results in a reduction in the tuning sensitivity of the voltage controlled oscillator.

Rather than being a distributed capacitive element, it is also envisioned that a chip capacitor can be substituted in place of the gap when a larger capacitive value is desired.

The radial stub 62 shown in FIGS. 1 and 4 serves to provide a RF virtual ground which is separate from DC ground and exhibits low parasitic reactances for the series connected capacitor-varactor combination and, as can be seen in FIG. 2, the distributed capacitor 66' and the varactor diode 12' are effectively connected in RF series with an impedance matching transformer 16' and in parallel with the Gunn diode 14'.

The correspondence between the microstrip variable frequency oscillator of FIG. 1, and especially its DC bias circuit, can be observed from FIG. 3 in which the DC equivalent circuit is depicted below the microstrip implementation of FIG. 1, with corresponding elements of each being vertically aligned for purposes of reference The DC voltage for biasing the varactor is applied to the bias input terminal and the fan elements 34, 36 and 38 along with lines 37 and 39 combine to form a low-pass filter for permitting the DC bias signal to reach the varactor diode 12' while blocking any feedthrough of RF energy. It is to be especially noted that the fixed capacitive element 66 which serves to reduce tuning sensitivity forms no part of the varactor dc bias circuitry. Likewise, the DC bias for the Gunn diode 14' is applied at terminal 44' with the reactance provided by the fan elements and lines 56 again creating a low-pass filter circuit for transmitting the DC while removing any RF energy appearing on the transmission line 20 from reaching the DC bias source. The blocking capacitors 60' shown in FIGS. 2 and 3 prevent the bias voltage from appearing in the RF output circuitry.

Referring next to FIG. 5, the broken line 68 is illustrative of the tuning sensitivity of a microstrip variable frequency oscillator such as set out in the Singh U.S. Pat. No. 4,574,256, which might typically be on the order of 200 MHz per volt of varactor bias applied. With the addition of the fixed capacitance element 66 in RF series with the varactor diode, a sensitivity curve, such as depicted by the solid line 70 in FIG. 5 results. It has a significantly reduced slope corresponding to a sensitivity of only 1 MHz/V of change in the tuning voltage yet does not compromise the linearity of the tuning characteristic.

Those skilled in the art will recognize that it is a relatively simple matter to adjust the tuning sensitivity by using a laser to trim the gap at the base of the radial stub 62 to vary its capacitance value and thus to modify the overall tuning sensitivity of the system. Also, the microstrip circuit will typically be contained in a channel formed in a block of brass or other suitable conductor and bias voltages and the VCO output are applied and taken, via appropriate electrical conductors, all as is commonly known in the art.

The circuit of the present invention finds application in serving as a driver for high power transmitters in the 35 GHz, i.e., the Ka band or, alternatively, as a transmitter for radar and communication systems. Because of its microstrip construction, it offers the advantages of low cost, compactness, and high reliability in adverse environments.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A planar varactor tuned microstrip oscillator for Ka band operation and exhibiting an adjustable tuning sensitivity comprising:
   (a) a varactor diode;
   (b) a source of DC bias voltage for said varactor diode, said source of DC bias being coupled between a point of DC ground potential and through a first microstrip line to said varactor diode, said first microstrip line functioning as a low pass filter at Ka band frequencies;
   (c) a Gunn diode;
   (d) a source of DC bias voltage for said Gunn diode, said source of DC bias being coupled through a second microstrip line, said second microstrip line functioning as a low pass filter at Ka band frequencies;
   (e) first microstrip transformer means coupling said varactor diode in series with said Gunn diode;
   (f) second microstrip transformer means coupling said Gunn diode to a high frequency microstrip output line; and
   (g) capacitive impedance means coupled in RF series circuit between a point of RF ground potential separate from said point of DC ground potential and said varactor diode for limiting the change in frequency of the signal on said output line with changes in said source of DC bias for said varactor diode.

2. The microstrip oscillator as in claim 1 wherein said capacitive impedance means comprises an open circuited radial stub disposed adjacent a portion of said first microstrip line with a gap of a predetermined width between said radial stub and said first microstrip line, said gap exhibiting a fixed capacitance value at the operating frequency, said open circuited radial stub constituting said point of RF ground potential.

3. The microstrip oscillator as in claim 2 and further including DC blocking means disposed in said high frequency microstrip output line.

* * * * *